(12) United States Patent
Petunin

(10) Patent No.: US 7,516,544 B1
(45) Date of Patent: Apr. 14, 2009

(54) SPACERS FOR REDUCING CROSSTALK AND MAINTAINING CLEARANCES

(75) Inventor: Vladimir V. Petunin, Boulder, CO (US)

(73) Assignee: Mentor Graphics Corporation, Wilsonville, OR (US)

( * ) Notice: Subject to any disclaimer, the term of this patent is extended or adjusted under 35 U.S.C. 154(b) by 1280 days.

(21) Appl. No.: 09/888,173

(22) Filed: Jun. 22, 2001

(51) Int. Cl.
*H05K 3/02* (2006.01)
*H01R 43/00* (2006.01)

(52) U.S. Cl. .............................. 29/846; 29/825; 29/847; 29/850

(58) Field of Classification Search .................... 29/825, 29/846, 847, 850
See application file for complete search history.

(56) References Cited

U.S. PATENT DOCUMENTS

| | | | | |
|---|---|---|---|---|
| 5,454,738 A | * | 10/1995 | Lim et al. .................... | 439/676 |
| 5,470,244 A | * | 11/1995 | Lim et al. .................... | 439/189 |
| 6,465,268 B2 | * | 10/2002 | Hirakata et al. ............... | 438/30 |

FOREIGN PATENT DOCUMENTS

| GB | 2233157 A | * | 1/1991 |
|---|---|---|---|
| GB | 2269941 A | * | 2/1994 |
| JP | 2-268484 | * | 11/1990 |

OTHER PUBLICATIONS

Chambers, William, "Noise In PCB Design", http://www.channel1.com/users/analog/noise.html, pp. 1-5, print-out dated Nov. 10, 2000 (1997 copyright notice).

* cited by examiner

*Primary Examiner*—C. J Arbes
(74) *Attorney, Agent, or Firm*—Banner & Witcoff, Ltd.

(57) ABSTRACT

In one aspect of the invention is a method for reducing crosstalk and maintaining clearances between traces on a printed circuit board design. Crosstalk caused by placing traces a virtual printed circuit board are reduced by placing artificial obstructs, called spacers, between traces and/or between traces and nets to create a user-specified clearance between the traces and/or nets. As additional traces and/or nets are added to the virtual printed circuit board, the spacers are dynamic and adjust accordingly to maintain the specified clearances.

10 Claims, 9 Drawing Sheets

SPACERS FOR REDUCING CROSSTALK AND MAINTAINING CLEARANCES

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

FIELD OF THE INVENTION

This invention relates to the field of printed circuit boards, and more specifically, to a method of efficiently reducing crosstalk and maintaining clearances between traces on a printed circuit board design.

BACKGROUND OF THE INVENTION

The printed circuit board (hereinafter "PCB") design starts when a designer selects the electronic components to perform required functions. The designer must then determine the most efficient and effective way to electronically interconnect the devices. There are many considerations in designing a PCB. One consideration, for example, is the way that traces on a PCB are laid out so as to reduce the amount of crosstalk (e.g., noise or interference) that can be emitted on the PCB.

FIG. 1 illustrates some of the main components on a PCB. The PCB of FIG. 1 shows two traces 110, 112, where each trace is a wire that is laid out on a PCB 100. A trace comprises vertical segments and horizontal segments. A trace can be placed between two pins (e.g., trace 110 is placed between pin 104 and pin 108; and trace 112 is placed between pin 102 and pin 106), or between a pin 102, 104, 106, 108 and a via 114, 116, 118, 120.

When one trace 110 is placed next to another trace 112 in a PCB design (hereinafter referred to as "virtual PCB"), crosstalk may result. The amount of crosstalk produced depends on the distance between the traces 110, 112. The farther the distance between the traces 110, 112, the less crosstalk there is. However, due to limited space on a PCB, a PCB must be designed such that the trace density on the virtual PCB 100 is maximized to accommodate all the required devices, and the crosstalk on the virtual PCB 100 is minimized.

To reduce the amount of crosstalk between traces 110, 112 when laying traces on a virtual PCB 100, it is necessary to keep certain clearances between them. The problem, however, is that it becomes difficult to maintain clearances and ensure stability of changes as more traces are routed. In current practice, if laying one trace down on a virtual PCB 100 causes crosstalk between existing traces or between the new trace and the existing traces, a designer must manually move the trace and/or the existing traces.

As shown in FIG. 2, crosstalk problems are fixed by moving vertical segments of traces 104A, 104B away from each other 200, 202 to cause a larger separation between the vertical segments of the traces 110, 112, thereby reducing crosstalk. As illustrated in FIG. 3, however, while crosstalk between two traces may be resolved, the placement of an additional trace 300 may again cause crosstalk between the existing traces 110, 112.

Since hundreds of traces may be routed on a single virtual PCB 100, it is easy to see that the manual movement of traces to reduce crosstalk and to maintain clearances may make for a very cumbersome PCB design process.

SUMMARY OF THE INVENTION

In one aspect of the invention, a method for laying traces on a printed circuit board is disclosed. The method comprises routing a first trace; routing a second trace, the second trace causing crosstalk; and reducing crosstalk between the first trace and the second trace by inserting a spacer between the traces.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

In one aspect of the invention, a method for reducing or eliminating crosstalk caused by trace layout on a printed circuit board is disclosed. Crosstalk rules that specify clearances to be maintained between traces on a PCB are defined, and consulted when designing a PCB. Where laying a first trace (an aggressor trace) next to a second trace (a victim trace) causes crosstalk on the virtual PCB, an artificial obstruct called a spacer is inserted between the two traces in accordance with crosstalk rules such that the specified clearances are maintained.

In a further aspect of the invention, a method for maintaining clearances between traces on a printed circuit board is disclosed. When specified clearances between traces on a virtual PCB are disturbed, spacers are dynamic and adjust in accordance with the crosstalk rules.

The present invention includes various operations, which will be described below. The operations of the present invention may be performed by hardware components or may be embodied in machine-executable instructions, which may be used to cause a general-purpose or special-purpose processor or logic circuits programmed with the instructions to perform the operations. Alternatively, the operations may be performed by a combination of hardware and software.

The present invention may be provided as a computer program product which may include a machine-readable medium having stored thereon instructions which may be used to program a computer (or other electronic devices) to perform a process according to the present invention. The machine-readable medium may include, but is not limited to, floppy diskettes, optical disks, CD-ROMs (Compact Disc-Read Only Memories), and magneto-optical disks, ROMs (Read Only Memories), RAMs (Random Access Memories), EPROMs (Erasable Programmable Read Only Memories), EEPROMs (Electrically Erasable Programmable Read Only Memories), magnet or optical cards, flash memory, or other type of media/machine-readable medium suitable for storing electronic instructions.

Moreover, the present invention may also be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection). Accordingly, herein, a carrier wave shall be regarded as comprising a machine-readable medium.

Introduction

Figure 1:
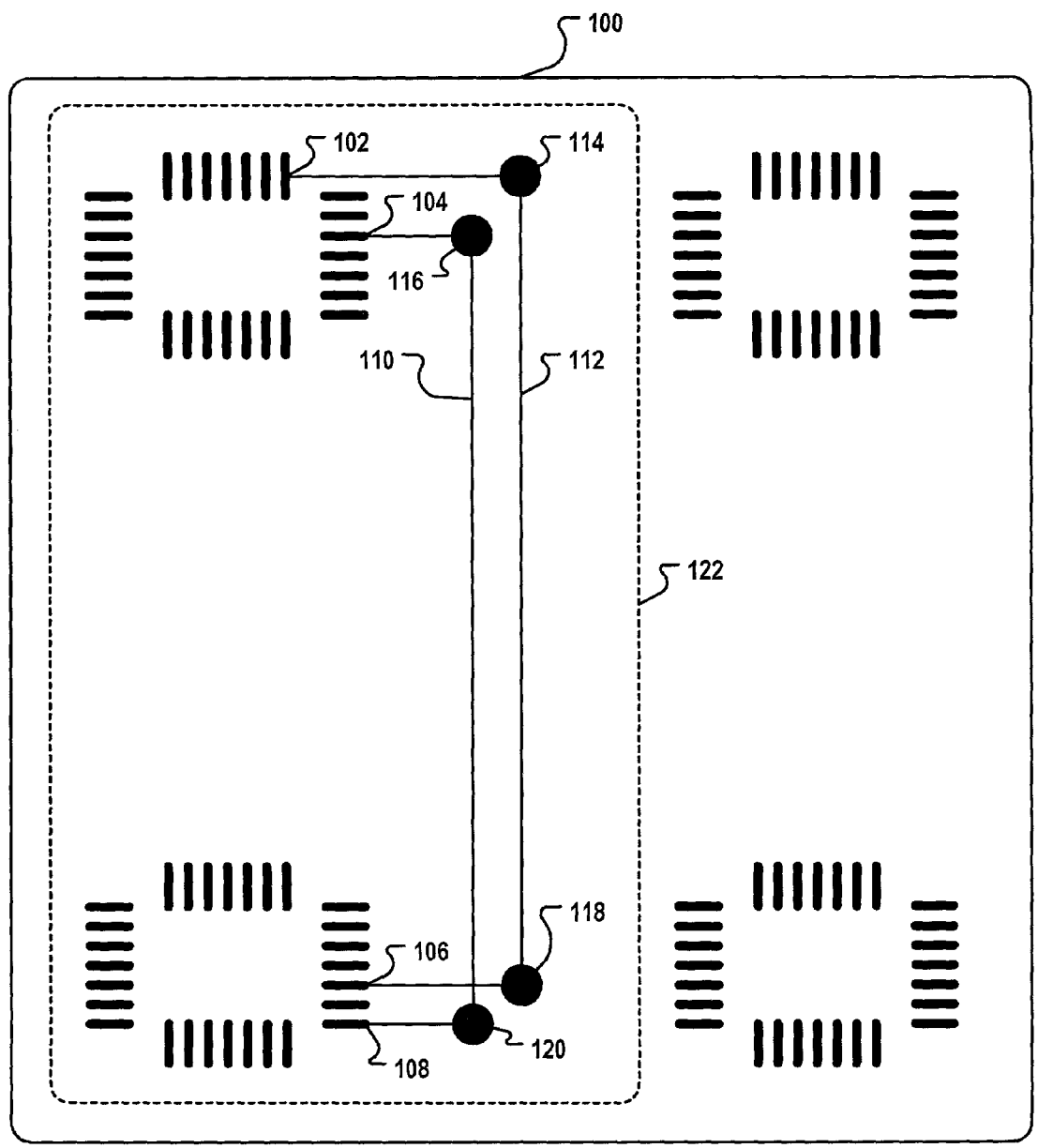
FIG. 1 illustrates a printed circuit board and common components.
Figure 2:
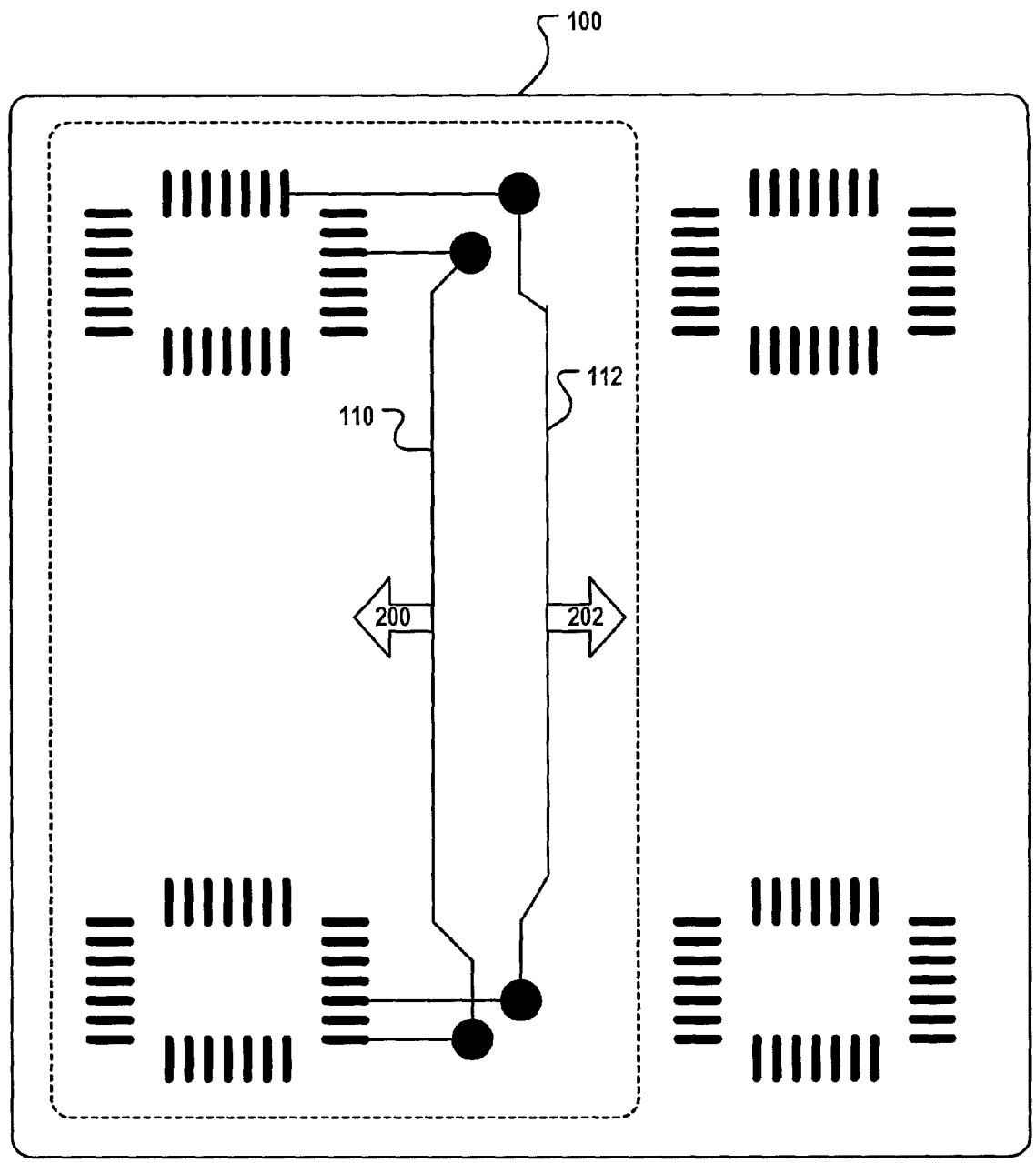
FIG. 2 illustrates current practice in reducing crosstalk.
Figure 3:
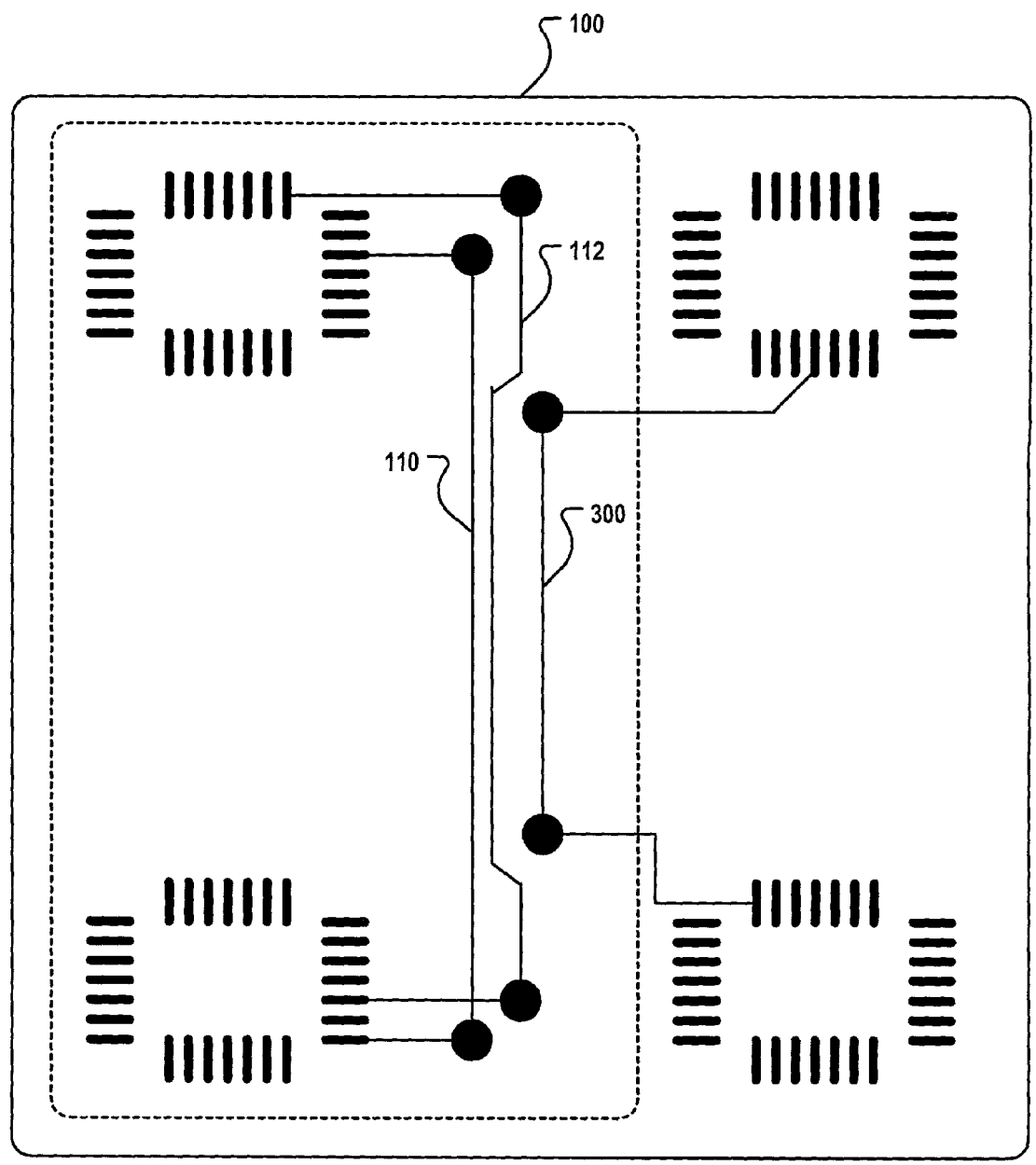
FIG. 3 illustrates the problem of maintaining clearances.

FIG. 1 illustrates a printed circuit board 100 comprising pins 102, 104, 106, 108, traces 110, 112, and vias 114, 116, 118, 122. A pin 102, 104, 106, 108 is a terminal on a component for establishing connections using a trace; a via 114, 116, 118, 120 is a plated through hole in a virtual PCB 100 used to route a trace vertically in the board, from one layer to another; and a trace 110, 112 is a predefined metal pathway printed on the surface of a virtual PCB 100 to layout a connection.

A given set of pins 102, 104, 106, 108, vias 114, 116, 118, 120, and traces 110, 112 that are all electrically connected is called a physical net 122. Electronic components are mounted on a virtual PCB 100 in one of two ways: component legs can be inserted through holes in the virtual PCB 100 and then attached to pad areas (i.e., geometric representations of a pin 102, 104, 106, 108 or a via 114, 116, 118, 120 on a given layer) on the opposite side of the board with solder; or component legs can be soldered directly to pad areas on the surface of the board.

A trace 110, 112 can be a victim trace or an aggressor trace. A victim trace is a trace that has been routed, and an aggressor trace is a trace that causes crosstalk on the PCB when it is laid next to the victim trace. Similarly, a net can be a victim net or an aggressor net, where a victim net is a set of interconnected traces, and an aggressor net is a set of traces that causes crosstalk. As used herein, crosstalk may occur between traces, or between nets.

A spacer may be attached to one or more traces, where the distance between the spacer and any given trace is zero: the spacer is said to have zero clearance. A spacer can also be attached to one to four sides of a victim net. It may be edge coupled to a victim net, appearing on each side of the victim net, or it can be broadside coupled to a victim net, appearing above and/or below the victim net.

A spacer can be attached as widely or as long as needed. Given a spacer of a certain length to reduce the amount of crosstalk, the spacer can be made shorter but wider to eliminate the same amount of crosstalk. This allows spacers to be inserted in areas where pads (geometrical representations of a pin or a via on a given layer) exist, and where pads are missing, spacer lengths can be greater.

In one aspect of the invention, spacers are inserted in accordance with crosstalk rules (also known as specified clearances) to reduce crosstalk between traces. In another aspect of the invention, spacers are smart in that they dynamically adjust in accordance with the crosstalk rules when specified clearances are disturbed. Crosstalk rules may comprise noise thresholds, which define the maximum crosstalk between traces or nets; and aggressor distances, which specify the maximum distance that an aggressor net may be from a victim net.

Noise Thresholds

Maximum crosstalk can be specified in crosstalk rules. Threshold can be defined in terms of physical threshold and/ or and electrical threshold. Physical thresholds can be specified by length of parallelism and spacing values, and electrical thresholds can be specified in terms of voltage, typically millivolts, and include both inductive and capacitive coupling.

For example, given a set of measured or calculated crosstalk readings at particular gap sizes (i.e., the distance between parallel traces), a table of physical lengths may be created comprising crosstalk limits. Thus, if a given trace experiences a crosstalk of 100 mV/inch at a gap size of $4^{th}$, and wishes to restrict total crosstalk on a net to 100 mV, one would divide 100 mV/inch by 100 mV and arrive at a maximum parallel run length of 1 inch. Crosstalk levels would then be computed at successive gap ranges (i.e., $4^{th}$, $8^{th}$, $12^{th}$) and corresponding length limits. Parallel sections can then be examined—the lengths of parallel sections at a given gap distance is added and divided by the maximum distance at that length. If an electrical threshold is specified, then calculations would be made for mVolts, for instance, which refers to the amount of noise that can be generated by adjacent traces.

Aggressor Distance

A designer can also specify the maximum distance that an aggressor net may be from a victim net. A specified distance determines how far out to look for an aggressor net on each side of a victim net (including the adjacent layer).

Reducing Crosstalk

Figure 4:
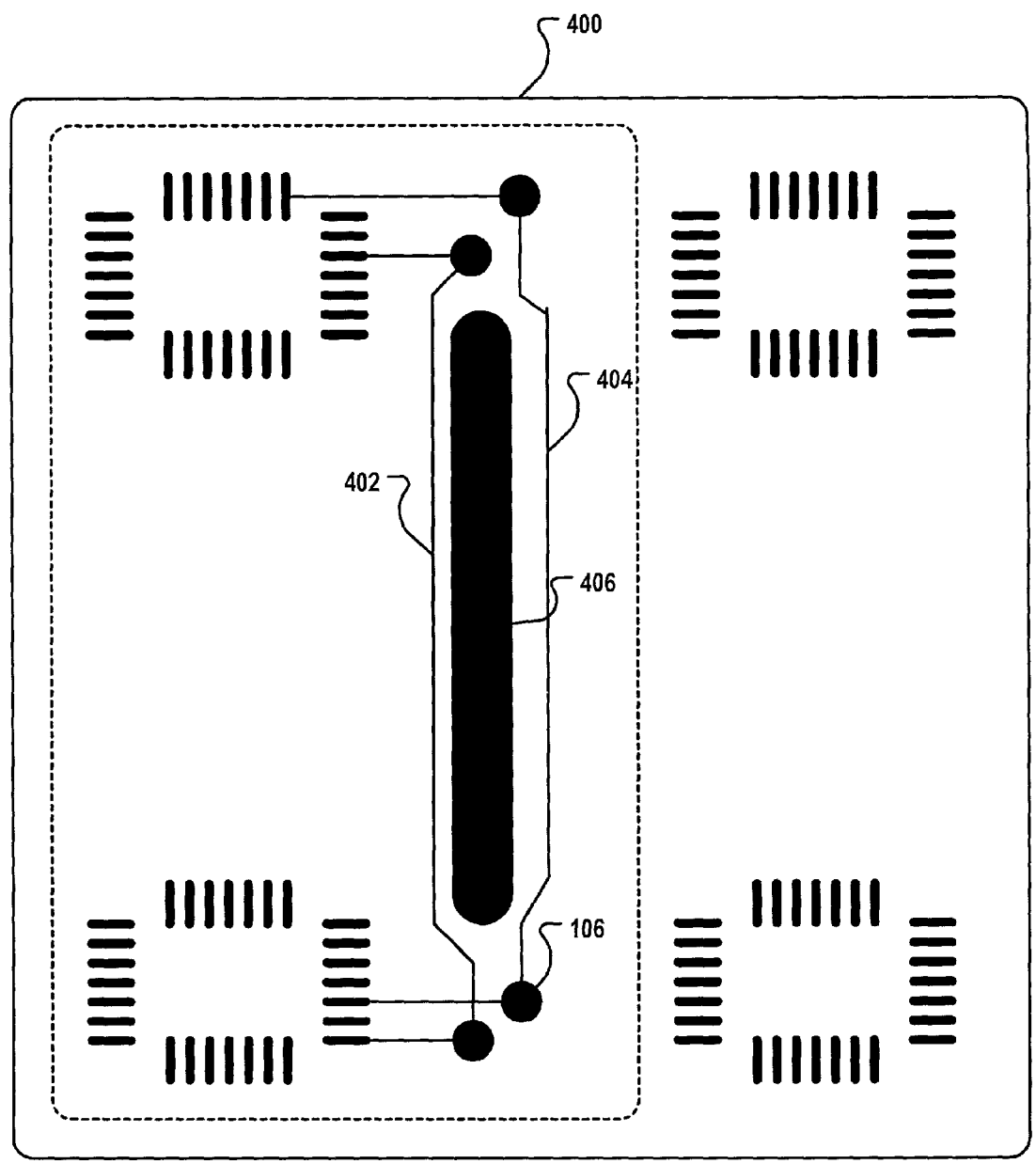
FIG. 4 illustrates the concept of a spacer.

FIG. 4 illustrates a virtual PCB 400 in which a spacer is used. It comprises a first trace 402, and a second trace 404, where the first trace will be referred to as the victim trace 402, and the second trace will be referred to as an aggressor trace 404. Between the two traces is an artificial obstruct called a spacer 406 for maintaining a specified clearance between the two traces 402, 404. The spacer 406 is artificial because it is inserted for the purpose of laying out traces on a printed circuit board, but will not appear on the final printed circuit board design.

When the aggressor trace 402 is laid next to the victim trace 400, and a specified clearance (i.e., noise threshold or an aggressor distance) has been exceeded, a spacer 406 is automatically inserted to meet the specified clearance.

Figure 5:
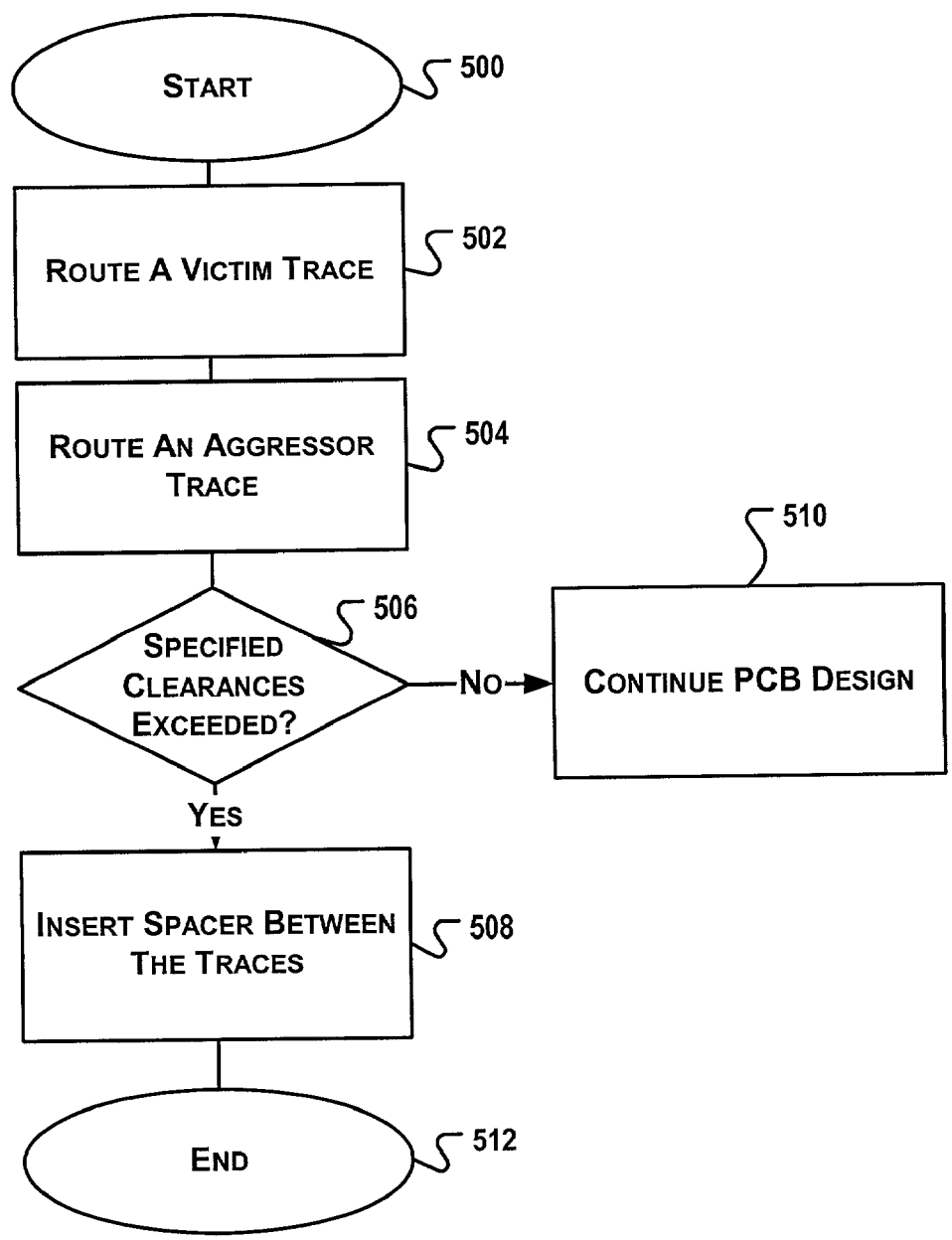
FIG. 5 is a flowchart illustrating a method for reducing crosstalk using spacers in accordance with one embodiment of the invention.

FIG. 5 is a flowchart illustrating a method in one embodiment for laying out traces on a printed circuit board to reduce crosstalk between traces. The method begins at block 500. A first trace (a victim trace) is routed at block 502. At block 504, a second trace (an aggressor trace) is routed. Specified clearances are checked at block 506. If the clearances are exceeded, then a spacer is then inserted between the first and second traces at block 508 so as to reduce crosstalk. If specified clearances are not exceeded, then PCB design continues at block 510 (i.e., it ends or more traces or nets are added). The method ends at block 512.

Aggressor Trace/Net Analysis

Spacers can be generated automatically, semi-automatically, or interactively. In one embodiment, spacers are inserted on a net-by-net, or a trace-by-trace basis. In automatic mode, spacers are automatically generated in accordance with crosstalk rules, such that they are attached to all traces and/or victim nets in order to create the minimum separation required to meet the maximum crosstalk values. For example, for a given victim net, and a specified aggressor net distance of 25 mils, an aggressor net is searched for on each side of the victim net at a distance of 25 mils. In the discussion below, what applies to nets also applies to traces.

All nets are checked. If a crosstalk rule has been assigned to a net, it is designated as a victim net. The crosstalk rules for the given victim net are checked. Any nets relative to the victim net that exceed the given crosstalk rule are then designated as an aggressor net, and a spacer is inserted between the victim net and the aggressor net. This process of finding victim nets and aggressor nets can be accomplished, for example, by using a lookup table based on user assigned parameters for crosstalk for each victim net.

In semi-automatic mode, violations, or victim nets in which maximum crosstalk values are exceeded, are searched for. When a violation is found, a spacer is inserted. The user then has the option to accept or reject the creation of the spacer. In embodiments of the invention, if the user accepts the creation, then the next violation is found and the process is repeated until all violations are resolved. If the user rejects the creation, then the spacer will try a different location or a different geometry for the spacer. Another option allows the user to reject the creation and manually move traces to try and resolve the violation.

In interactive mode, crosstalk rules are not examined, and users can randomly select one or more nets and specify that a spacer be attached. The user can specify a length and width of the spacer to be used. For example, the user could drag a box around 32 bits of a bus on a specific layer in a specific region of the virtual PCB and attach spacers.

Figure 6:
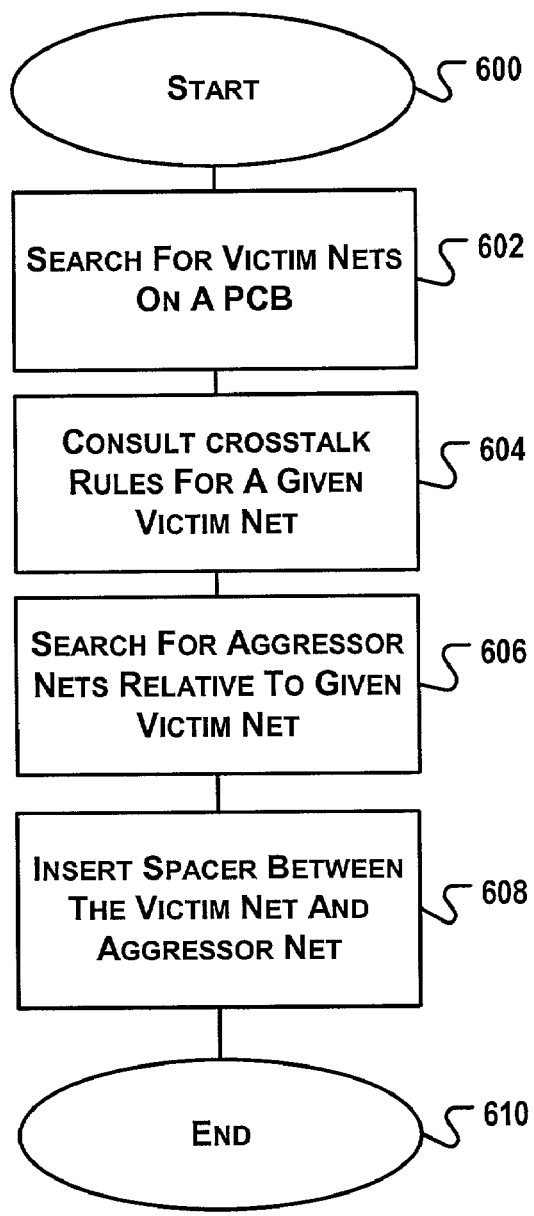
FIG. 6 is a flowchart illustrating a method for reducing crosstalk using spacers in accordance with another embodiment of the invention.

FIG. 6 is a flowchart illustrating a method in another embodiment for laying out traces on a printed circuit board to reduce crosstalk between traces. The method begins at block 600. At block 602, victim nets on a virtual PCB are searched for. This is accomplished by finding nets having crosstalk rules.

When a victim net is found, crosstalk rules are consulted for the victim net at block 604. At block 606, aggressor nets relative to the victim net are searched for. This is accomplished by finding if a net adjacent to the given victim net exceeds the crosstalk rules for the given victim net. When an aggressor net is found, a spacer is inserted at block 608. The method ends at block 610.

In variations of this method, as described above, a user may accept or reject an inserted spacer after block 608.

Dynamic Spacers

In a further aspect of the invention, a method for maintaining specified clearances between traces on a printed circuit board is disclosed. During subsequent editing of traces, including adds, deletes, and modifications, the required clearances are kept intact to meet maximum crosstalk rules. In this respect, spacers automatically adjust in length or width as needed. The user may even adjust the height, in which case the width will be automatically adjusted, or the user may adjust the width, in which case the height will be automatically adjusted. For example, if moving one trace will cause crosstalk rules to be violated, then an attached spacer will automatically adjust in length or width in accordance with the crosstalk rules.

Figure 7:
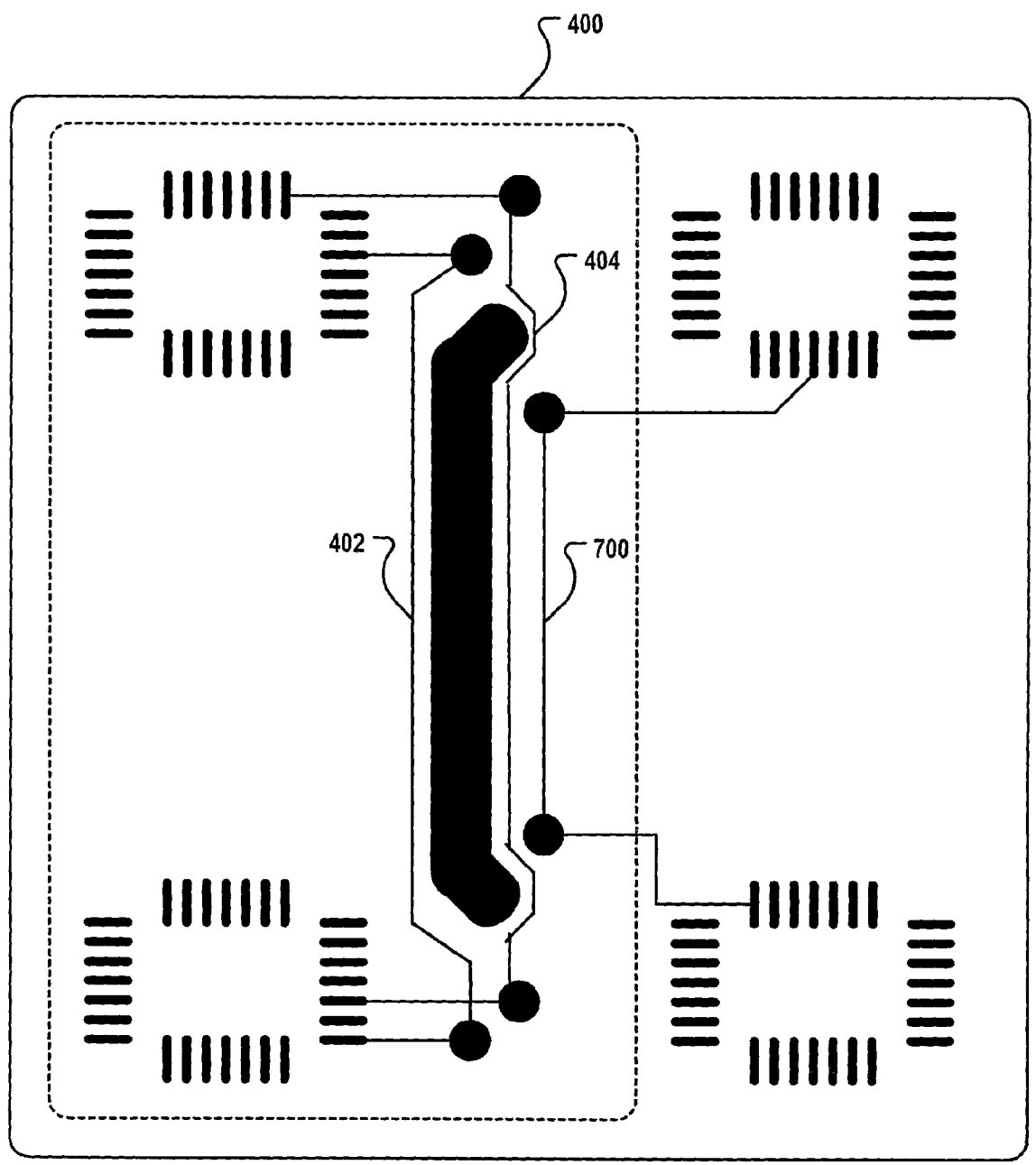
FIG. 7 illustrates the concept of maintaining clearances by using a spacers.

This concept is illustrated in FIG. 7. In FIG. 7, a trace 700 is added to the virtual PCB of FIG. 4, pushing the initial traces 402, 404 as well as the spacer 406. However, since a spacer 406 exists between the two initial traces 402, 404, the clearance between the initial traces 402, 404 is maintained.

Figure 8:
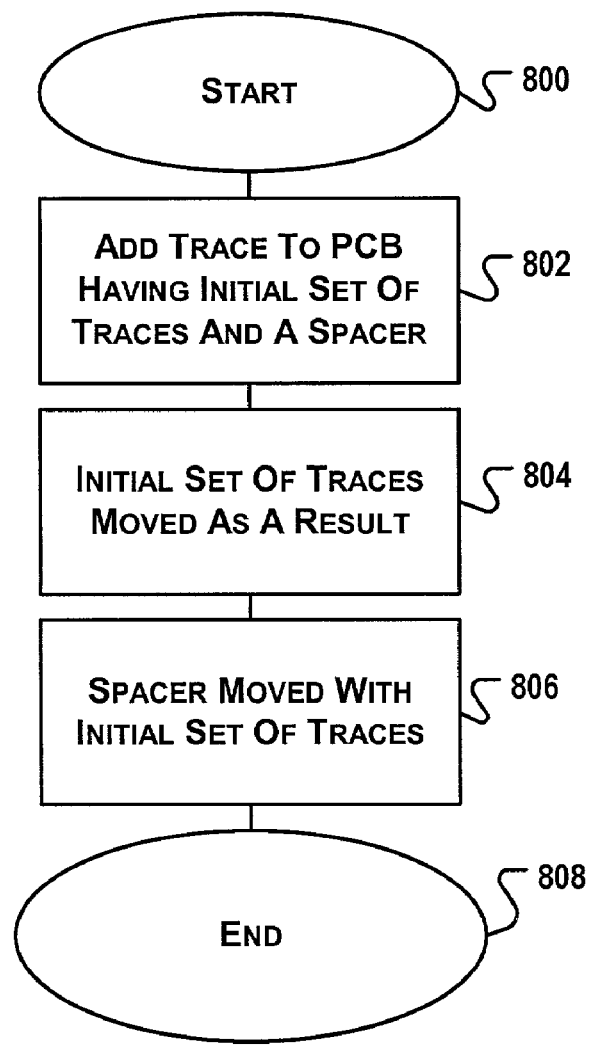
FIG. 8 is a flowchart illustrating a method for maintaining specified clearances in accordance with embodiments of the invention.

FIG. 8 illustrates a method for preserving specified clearances. It starts at block 800. At block 802, a trace is added to a virtual PCB having an initial set of traces having a corresponding spacer to meet specified clearances. At block 804, the initial set of traces is moved as a result of placing the additional trace. At block 806, the spacer moves with the initial set of traces, thereby maintaining the specified clearances. The method ends at block 808.

Computer System

Figure 9:
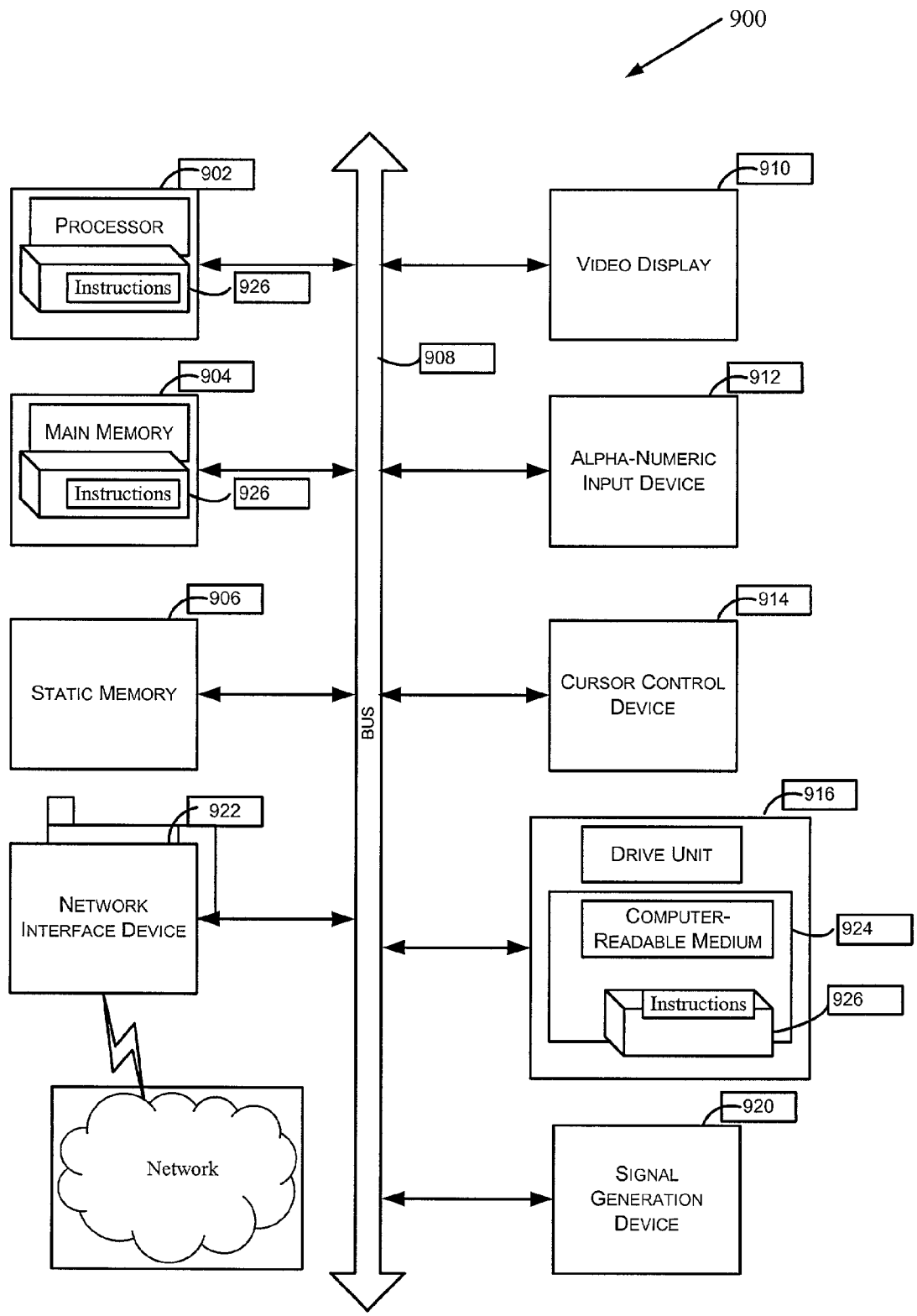
FIG. 9 illustrates an exemplary computer system in which embodiments of the invention may be implemented.

FIG. 9 is a diagrammatic representation of a machine in the form of computer system 900 within which software, in the form of a series of machine-readable instructions, for performing any one of the methods discussed above may be executed. The computer system 900 includes a processor 902, a main memory 904 and a static memory 906, which communicate via a bus 908. The computer system 900 is further shown to include a video display unit 910 (e.g., a liquid crystal display (LCD) or a cathode ray tube (CRT)).

The computer system 900 also includes an alphanumeric input device 912 (e.g., a keyboard), a cursor control device 914 (e.g., a mouse), a disk drive unit 916, a signal generation device 920 (e.g., a speaker) and a network interface device 922. The disk drive unit 916 accommodates a machine-readable medium 924 on which software 926 embodying any one of the methods described above is stored. The software 925 is shown to also reside, completely or at least partially, within the main memory 904 and/or within the processor 902.

The software 926 may furthermore be transmitted or received by the network interface device 922. For the purposes of the present specification, the term "machine-readable medium" shall be taken to include any medium that is capable of storing or encoding a sequence of instructions for execution by a machine, such as the computer system 900, and that causes the machine to perform the methods of the present invention. The term "machine-readable medium" shall be taken to include, but not be limited to, solid-state memories, optical and magnetic disks, and carrier wave signals.

CONCLUSION

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

For example, concepts which apply to traces also apply to nets, and vice versa. Thus, spacers may be added to a trace, traces, a net, and/or nets, without departing from the spirit and scope of the invention.

What is claimed is:

1. A method of routing traces on a virtual printed circuit board (PCB), comprising:
   routing a first trace on the virtual PCB;
   routing a second trace on the virtual PCB; and
   inserting a spacer between the traces on the virtual PCB, wherein the spacer maintains one or more specified clearances between the first trace and the second trace and wherein the spacer is a virtual construct that does not appear on a corresponding real printed circuit board.

2. The method of claim 1, wherein inserting comprises:
   automatically inserting the spacer between the first trace and the second trace in accordance with predefined rules, wherein the predefined rules define the one or more clearances to be maintained between the first trace and the second trace.

3. The method of claim 2, wherein one or more of the one or more clearances comprises a noise threshold that specifies a predefined measure of crosstalk, wherein a spacer is inserted if a calculated measure of crosstalk between the first trace and the second trace exceeds the predefined measure of crosstalk.

4. The method of claim 3, wherein the predefined measure of crosstalk comprises one or more electrical quantities.

5. The method of claim 2, wherein one or more of the one or more clearances comprises a predefined distance, wherein no spacer is inserted if a distance between the first trace and the second trace exceeds the predefined distance.

6. The method of claim 1, additionally comprising:
modifying the first trace; and
automatically modifying the spacer to maintain one or more of the one or more specified clearances between the first and second traces.

7. A method of routing traces on a virtual printed circuit board (PCB), comprising:
routing a first trace on the virtual printed circuit board;
positioning a spacer adjacent to the first trace on the virtual PCB; and
routing a second trace on the virtual PCB separated from the first trace by the spacer, wherein the spacer maintains one or more specified clearances between the first trace and the second trace and wherein the spacer is a virtual construct that does not appear on a corresponding real printed circuit board.

8. The method of claim 3, wherein the predefined measure of crosstalk comprises one or more spatial dimensions of the virtual PCB.

9. The method of claim 2, wherein inserting additionally comprises automatically determining the spatial geometry of the spacer in accordance with the predefined rules.

10. The method of claim 2, wherein inserting additionally comprises moving the first trace when one of the predefined rules is violated.

* * * * *